United States Patent
Lamphier et al.

[11] Patent Number: 5,666,078
[45] Date of Patent: Sep. 9, 1997

[54] PROGRAMMABLE IMPEDANCE OUTPUT DRIVER

[75] Inventors: Steven H. Lamphier, St. Albans; Harold Pilo, Underhill, both of Vt.; Michael J. Schneiderwind, Castlerock, Colo.; Fred J. Towler, Essex Junction, Vt.

[73] Assignee: International Business Machines Corporation, Armonk, N.Y.

[21] Appl. No.: 597,655

[22] Filed: Feb. 7, 1996

[51] Int. Cl.$^6$ ............................................. H03K 19/0185
[52] U.S. Cl. ............................................. 327/108; 326/30
[58] Field of Search ............................ 327/63, 64, 108, 327/109, 111, 112, 210, 211, 212; 326/30, 37, 40, 49, 50, 82, 83, 86

[56] References Cited

PUBLICATIONS

Thaddeus J. Gabara and Scott C. Knauer; Digitally Adjustable Resistors in CMOS for High–Performance Applications; Mar. 12, 1992.

*Primary Examiner*—Timothy P. Callahan
*Assistant Examiner*—My-Trang Nu Ton
*Attorney, Agent, or Firm*—Schmeiser, Olsen & Watts; Howard J. Walter, Jr.

[57] ABSTRACT

An output driver circuit is disclosed that generates an accurate and predictable output impedance driver value corresponding to a programmable external impedance. The output driver circuit includes an external resistance device, voltage comparator device, control logic, an evaluate circuit and off-chip driver (OCD) circuit. Voltage from the external resistance device (VZQ) is compared with voltage created from the evaluate circuit (VEVAL) by the voltage comparator device, which indicates to the control logic whether VEVAL is greater than or less than VZQ. The control logic will adjust the evaluate circuit accordingly with a count until the two voltages are basically equal (i.e., the count is alternating between two adjacent binary count values). At which time the control logic operates the OCD with the lower of the two adjacent count values to produce a proper and predictable driving impedance.

9 Claims, 3 Drawing Sheets

1

PROGRAMMABLE IMPEDANCE OUTPUT DRIVER

BACKGROUND OF THE INVENTION

1. Technical Field

The invention relates generally to output driver circuits and, more specifically, to output driver circuits with programmable impedances.

2. Background Art

In electrical systems, output drivers are used to drive input/output (I/O) devices or similar loads. Each output driver is set up with a certain voltage/impedance that matches the strength of the transmission line and I/O device being driven by that specific driver. Thus, I/O devices with a low drive strength would need an output driver with a high impedance, and high strength I/O devices require a low impedance driver. Since each output driver typically has only one impedance rating, an output driver driving a load other than the one it is designed for would result in too much or too little of the strength needed. In addition, output driver impedance variations as a result of supply voltage, temperature, and process variations may be as high as 100% of the desired impedance. Consequently, such a system would suffer in performance from factors such as slow downs of a high performance system and/or dissipation of dc power. The mismatch between the SRAM Output Driver and the characteristic line impedance of the system is very undesirable in high performance and small signal applications, such as cache to processor I/O interfaces. Furthermore, if a separate part was designed for the many different load strengths across different systems, the costs may become expensive.

One solution to overcome using several single impedance output drivers is to use one output driver with a variable resistor external to the output driver. Therefore, a user may change the external resistor of the driver to reflect the voltage/impedance needed to drive a load.

The article entitled, "Digitally Adjustable Resistors in CMOS for High-Performance Applications" by Gabara et al., which is hereby incorporated by reference, discloses an output driver circuit with a digital adjustable resistor. The output driver circuit is employed with CMOS circuitry. The driver has an impedance that matches the transmission line being driven that is formed from a transistor whose width is adjusted by digital means. The overall impedance of the driver circuit is obtained through the circuit's "count". Counters are used to "lock" in that final count. Unfortunately, depending on whether the counters were in the process of counting up, or counting down, the final count obtained will be a different value. Thus, the tolerance of the system varies, which will degrade a system's performance. Furthermore, there are no means to save power in the system.

Accordingly, a need has developed in the art for an output driver circuit that will not only provide a variable impedance in its circuitry, but will produce the same final count, and thus, the same final impedance when supplied with the same reference impedance, regardless of the starting count.

SUMMARY OF THE INVENTION

It is thus an advantage of the present invention to provide a variable impedance output driver circuit that accurately accounts for each final impedance value.

It is a further advantage of the present invention to provide a variable impedance output driver circuit that prevents glitches on the I/O bus.

It is yet a further advantage of the present invention to provide a variable impedance output driver circuit that conserves power.

The foregoing and other advantages of the invention are realized by an output driver circuit that generates an accurate and predictable impedance value corresponding to a programmable external impedance. The output driver circuit includes an external impedance device, voltage comparator device, control logic, an evaluate circuit and off-chip driver (OCD) circuit.

Voltage from the external resistance device (VZQ) is compared with voltage created from the evaluate circuit (VEVAL) by the voltage comparator device, which indicates to the control logic whether VEVAL is greater than or less than VZQ. The control logic will adjust the evaluate circuit accordingly with a count until the two voltages are basically equal (i.e., the count is alternating between two adjacent binary count values). At which time the control logic operates the OCD with the lower of the two adjacent count values to produce a proper and predictable driving impedance.

The foregoing and other objects, features and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE BEST MODE FOR CARRYING OUT THE INVENTION

Figure 1:
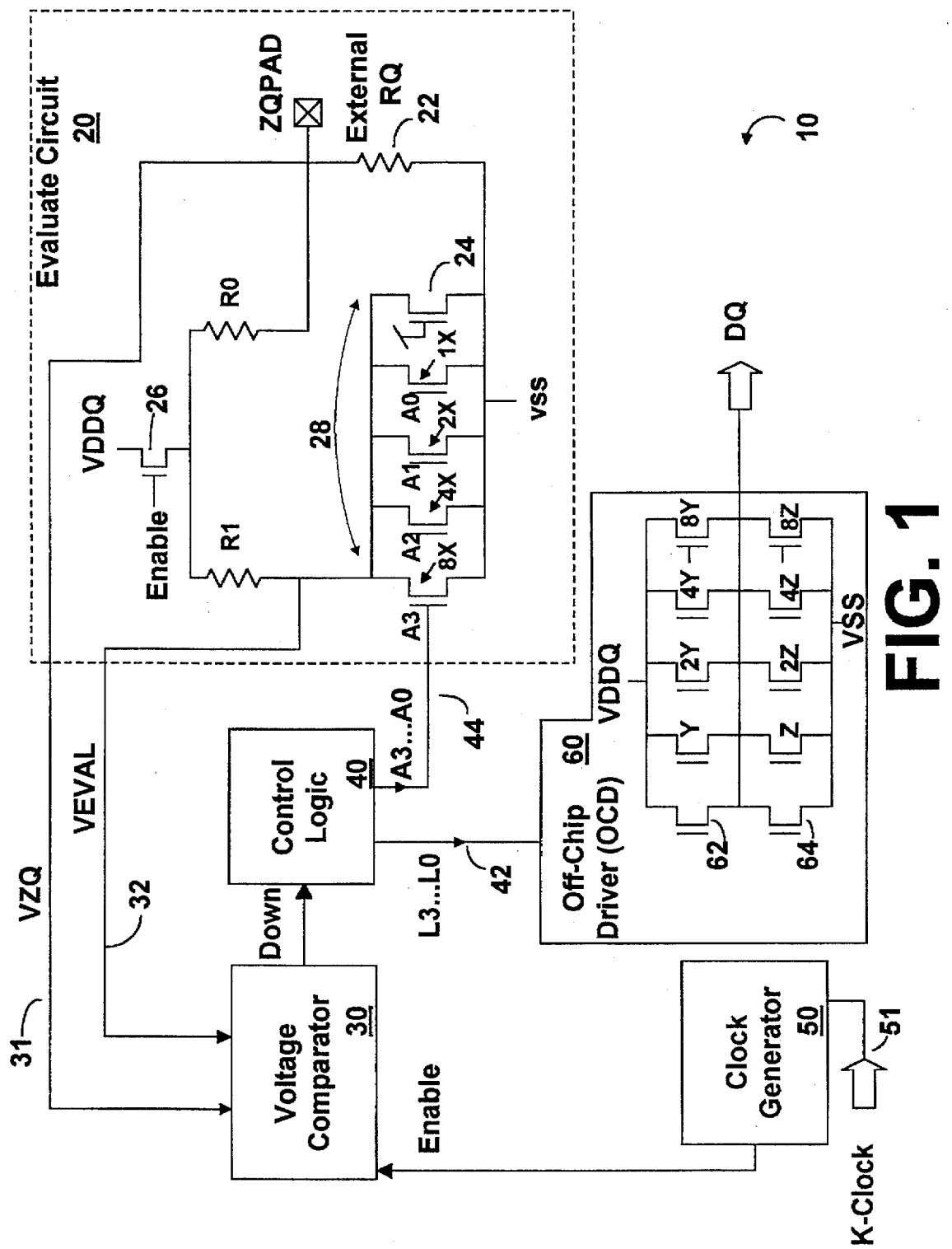
FIG. 1 is a block diagram illustrating the programmable impedance output driver circuit in accordance with a preferred embodiment of the present invention.

With reference to FIG. 1, a block diagram of a preferred embodiment of the output driver system 10 of the present invention is shown. Evaluate Circuit 20 is coupled to Voltage Comparator Device 30 through lines 31 and 32. A Clock Generator Device 50 is coupled to a K-Clock input 51, transistor 26 in Evaluate Circuit 20, and Voltage Comparator 30. The Voltage Comparator 30 is then coupled to Control Logic Device 40, which in turn is coupled to Evaluate Circuit 20 and Off-Chip Driver Device (OCD) 60. Output DQ is coupled to the Off-Chip Driver Device 60.

The Evaluate Circuit 20 comprises External RQ, also known as external resistance device 22, which is coupled to an SRAM programmable impedance pad (ZQPAD), resistor R0, incremental binary-weighted transistors 28, ground VSS, and Voltage Comparator 30. VSS is intentionally separated from the other Chip Grounds to eliminate DC drops across the metal routing of this supply to the ZQPAD. It may be externally connected to Chip Ground. Resistor R0 is coupled to resistor R1 and the output driver supply voltage VDDQ, which is enabled through transistor 26. The range of VDDQ is typically between 1.4 V to 1.6 V with a nominal value of 1.5 V. The binary-weighted transistors 28 consist of transistors of incremental proportions (i.e., 1X, 2X, 4X, and 8X) and is coupled to Voltage Comparator 30, R1, Control Logic Device 40 and External RQ 22.

Off-Chip Driver (OCD) device 60, see FIG. 3a of Gabara et al., comprises ten incremental transistors: 62, Y, 2Y, 4Y, 8Y (coupled in parallel) and 64, Z, 2Z, 4Z, 8Z 8B (coupled in parallel); which are coupled to VSS, VDDQ, Control Logic Device 40, and Output DQ. As described in more detail in Gabara et al., transistors 62 and zero or up to four of transistors Y, 2Y, 4Y and 8Y are rendered conductive in response to data out D being active (data out=high) and transistor 64 and zero to four of transistors Z, 2Z, 4Z and 8Z are rendered conductive in response to data out-no D (data out=low).

In operation, the desired impedance for the output driver circuit is programmed through the Programmable Impedance Pad (ZQPAD). That is, a SRAM user supplies an external impedance corresponding to the load strength desired. In the preferred embodiment, the external resistor RQ is 5 times the desired output driver impedance, and has a range of 175–350 Ohms to match a desired output driver impedance of 35–70 Ohms. The amount of signal for the specified range of RQ is maximized through voltage VZQ. VZQ is compared with the voltage level VEVAL existing on the binary-weighted transistors 28 by Voltage Comparator Device 30. An up/down signal DOWN from the Voltage Comparator Device 30 is then produced to indicate to the Control Logic Device 40 the differences between the two voltages. If VEVAL is higher than VZQ, DOWN will pulse Low. Likewise, if VEVAL is lower then VZQ, DOWN will pulse High.

Based upon the value of the control signal DOWN, the Control Logic Device 40 will then produce a count from count bits A3, A2, A1 and A0. These bits, inputted into the gates of the transistors 8X, 4X, 2X, and 1X, respectively, alter the binary-weighted transistors, which in turn adjust the voltage VEVAL closer in value to voltage VZQ. Once equilibrium between VZQ and VEVAL is reach, the DOWN signal will alternate between a Low and a High signal. This occurs because count bits A0–A3 are switching between adjacent binary values. To prevent the update count (the count running the OCD device 60 through line 42) from switching after equilibrium, a comparison between the present value of A0–A3 and its previous value (B0–B3; see FIG. 2) is made. The lower of the two is then used as the update count to control the OCD Device 60 and lock in its binary-weighted transistors at a known value. There are 16 incremental binary steps in the OCD device 60 that get switched as the need for increase/decrease in impedance is sensed. Thus, more tolerance is built into the system and accuracy can be accounted for. Furthermore, as application conditions vary across their specified range, and for any given process corner within the specified range, the output driver impedance will be compensated with the addition or subtraction of incremental binary-weighted transistors, so that the effective impedance remains ±10% of the desired impedance. That is, the circuit will maintain an OCD impedance of RQ/5±10% over application and process variations.

A divide-by-64 clock generator 50 is used to conserve power throughout the voltage divider networks, triggering the voltage comparator to turn on only after every 64 counts. Thus, no current dissipates in the circuit while the circuit is in a "standby" phase and power and energy is conserved within the system. The generator 50 also prevents glitches on the I/O bus that result from a sudden increase/decrease of switching currents. It is to be understood that other clock generators may be used, such as a divide-by-32, etc. depending on the power conservation desired.

Figure 2:
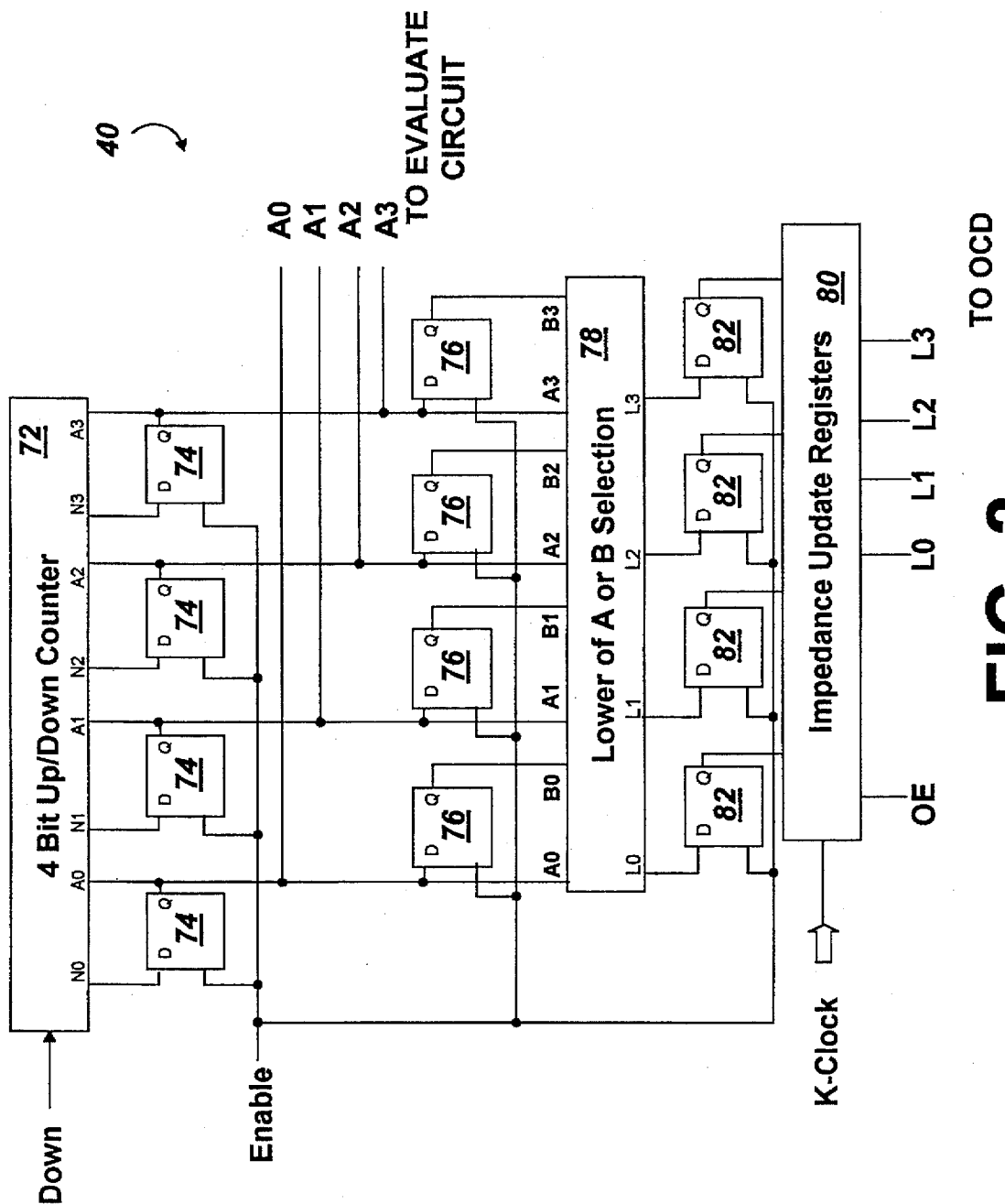
FIG. 2 is a schematic diagram of the control logic circuitry of FIG. 1.

As seen in FIG. 2, the details of the Control Logic Device 40 are illustrated. The DOWN signal enters into a 4 bit Up/Down Counter with wrap control 72. This counter produces the count bits A3–A0 through flip-flops 74. The bit signals are then latched through flip-flops 76. Thus, flip-flops 76 record a history of bits A3–A0, and when a new bit count A3–A0 is generated by flip-flops 74, the bits B3–B0 will correspond to the old bit count A3–A0. A Selection device 78 will then select the lowest of the L3–L0. This selection L3–L0 then travels through flip-flops 82 and reside at update registers 80, which are updated every 64 clock pulse for power conservation. The update registers 80 provide the inputs L3–L0 to the OCD 60. Although flip-flops are disclosed in accordance with the preferred embodiment of the invention, any suitable latching device may be used and is within the scope of the invention.

Figure 3:
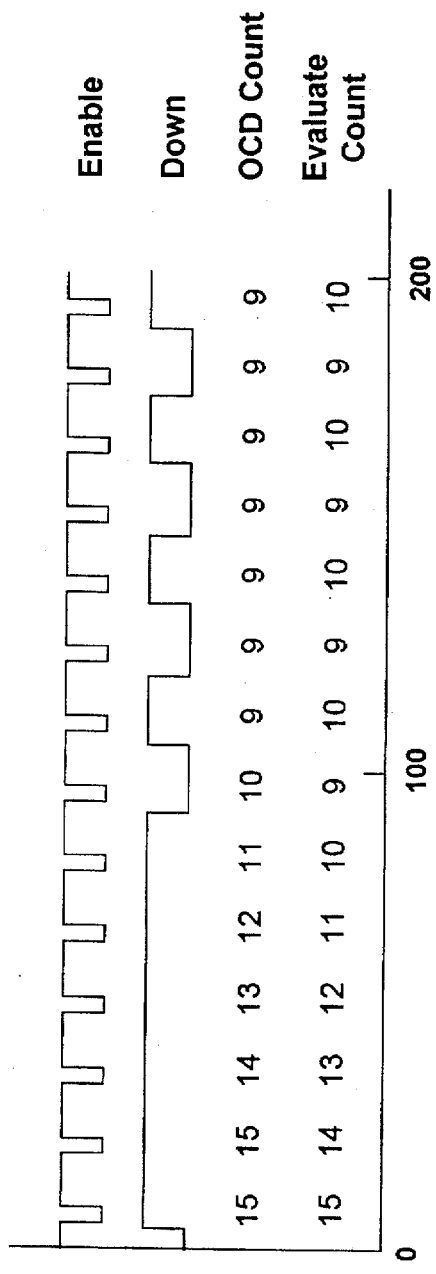
FIG. 3 is a timing diagram of the count bits of the output driver circuit of FIG. 1 in accordance with a preferred embodiment of the present invention.

FIG. 3 illustrates the timing diagram of the bit counts and locking feature of the circuit. The enable and down signals are also shown. The Enable signal will pulse every 64 clock pulse cycle, at which time the Evaluate Count (bits A3–A0 from Control Logic Device 40) will move towards equilibrium. In addition, a new count L3–L0 (comprising either bits A3–A0 or B3–B0) will be updated at the update registers 80 and appear as the OCD Count. As aforementioned, the DOWN signal will be High as long as VEVAL is lower than VZQ. As the Evaluate Count moves toward equilibrium, the DOWN signal will alternate between High and Low. Thus, in this example, even though the Evaluate Count A3–A0 will vary between 9 and 10, the OCD count will lock in at 9, allowing for more predictability and tolerance of the system. This is especially important in achieving high performance goals in applications where high performance is mandatory, such as dealing with a cache memory.

Figure 4:
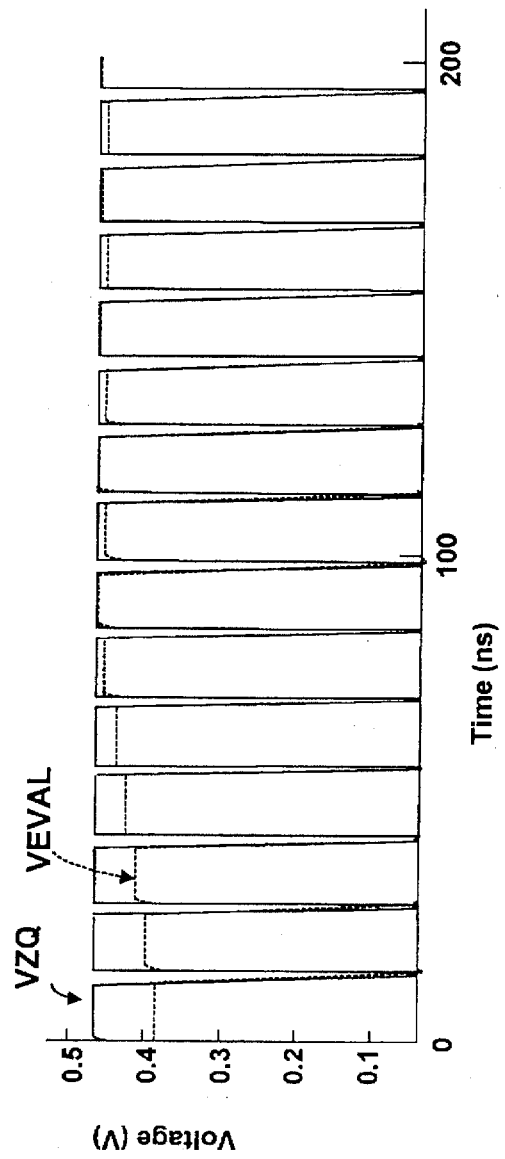
FIG. 4 is a timing diagram of the voltages produced in FIG. 3 in accordance with the preferred embodiment of the present invention.
Figure 1:
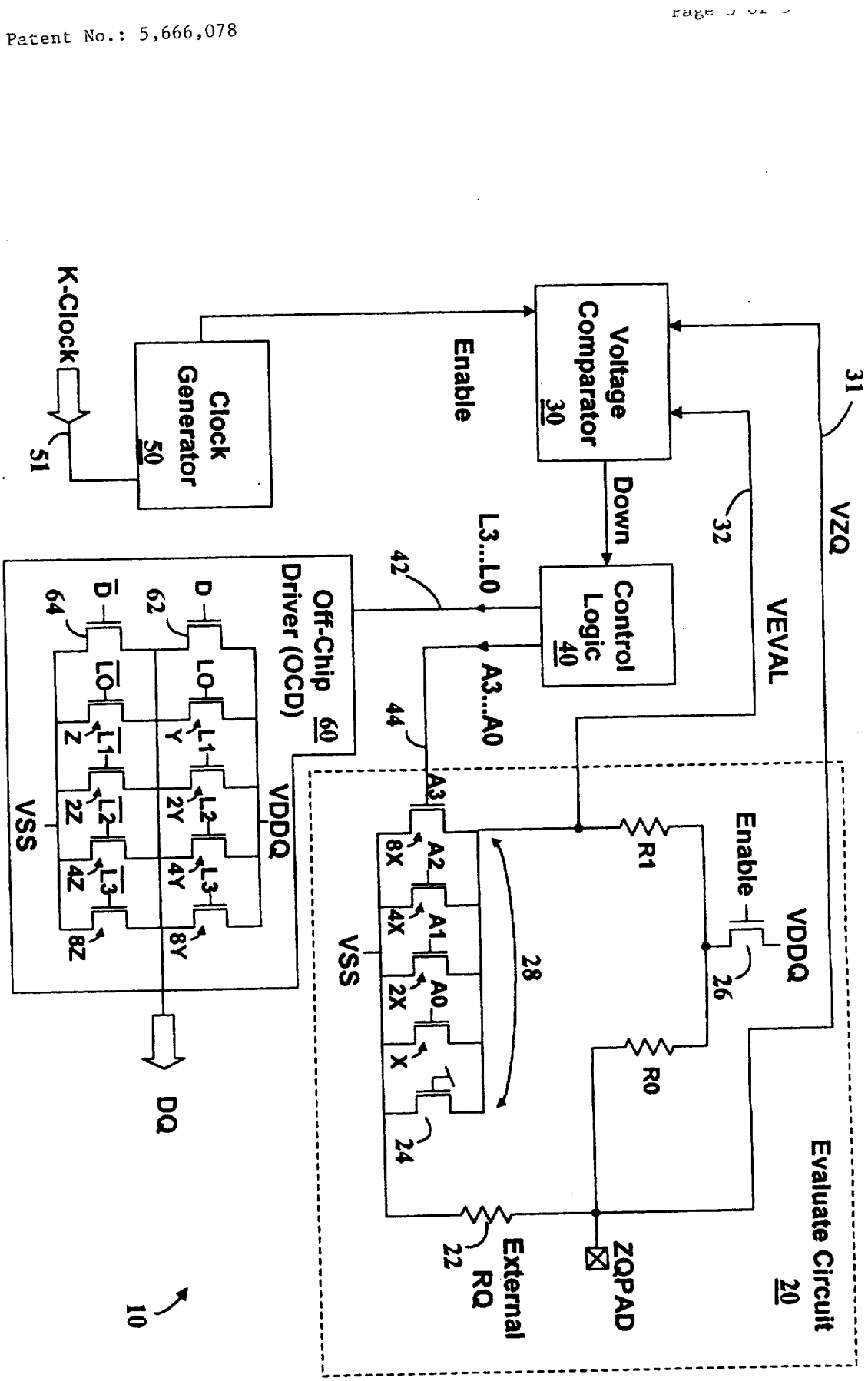

FIG. 4 illustrates the waveform of the two voltages VZQ and VEVAL generated through the example of FIG. 3. VZQ is the desired voltage corresponding with the impedance that was programmed into the ZQPAD and VEVAL is the voltage produced from the binary-weighted transistors corresponding to, for this example, the Evaluate Count of FIG. 3. As aforementioned, the circuit will maintain an OCD impedance of RQ/5±10% over application and process variations.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An output driver circuit, comprising:
   an external resistance device for programming a desired impedance into said output driver circuit;
   a voltage comparative device, coupled to said extreme resistance device, for comparing a voltage of said desired impedance with an evaluate voltage and generating a signal indicating which of said voltages is higher;
   a control logic device, coupled to said voltage comparative device, for receiving said signal and generating a first and second count from said signal, wherein said second count corresponds to a prior first count;
   an evaluate device, coupled to said control logic device and said voltage comparative device, for receiving said first count and modifying said evaluate voltage with said first count to more closely resemble said voltage of said desired impedance;

a low select device, coupled to said control logic device, for receiving said first and second count, and selecting and outputting the lowest of said first and second count; and an output device, coupled to said low select device, for receiving said output of said low select device and generating an output impedance corresponding to said output of said low select device.

2. The circuit of claim 1, wherein said evaluate device further comprises:

binary-weighted transistors, wherein each of said transistors receive a bit value from said first count and is turned off or on according to said bit value.

3. The circuit of claim 1, further comprising:

a clock generator device, coupled to said voltage comparator device and said evaluate device, for placing said voltage comparator device and said evaluate device in a standby phase for a desired amount of time, wherein no current dissipates in said circuit during said standby phase.

4. A method for matching a desired impedance with an output impedance of an output driver circuit comprising the steps of:

a) programming said desired impedance into said output driver circuit;

b) comparing a voltage of said desired impedance with an evaluate voltage and generating a signal indicating which of said voltages is higher;

c) generating a first and second count from said signal, wherein said second count corresponds to a prior first count;

d) modifying said evaluate voltage with said first count to more closely resemble said voltage of said desired impedance;

e) selecting and outputting the lowest of said first and second count; and f) generating an output impedance corresponding to said output of said lowest of said first and second count.

5. The method of claim 4, wherein said modifying step further comprises the step of:

providing binary-weighted transistors, wherein each of said transistors receive a bit value from said first count and is turned off or on according to said bit value.

6. The method of claim 4, further comprising the step of:

placing said output driver circuit in a standby phase for a desired amount of time, wherein no current dissipates in said circuit during said standby phase.

7. A system having an output driver circuit, said system comprising:

an external resistance device for programming a desired impedance into said output driver circuit;

a voltage comparative device, coupled to said external resistance device, for comparing a voltage of said desired impedance with an evaluate voltage and generating a signal indicating which of said voltages is higher;

a control logic device, coupled to said voltage comparative device, for receiving said signal and generating a first and second count from said signal, wherein said second count corresponds to a prior first count;

an evaluate device, coupled to said control logic device and said voltage comparative device, for receiving said first count and modifying said evaluate voltage with said first count to more closely resemble said voltage of said desired impedance;

a low select device, coupled to said control logic device, for receiving said first and second count, and selecting and outputting the lowest of said first and second count; and an output device, coupled to said low select device, for receiving said output of said low select device and generating an output impedance corresponding to said output of said low select device.

8. The system of claim 7, wherein said evaluate device further comprises:

binary-weighted transistors, wherein each of said transistors receive a bit value from said first count and is turned off or on according to said bit value.

9. The system of claim 7, further comprising:

a clock generator device, coupled to said voltage comparator device and said evaluate device, for placing said voltage comparator device and said evaluate device in a standby phase for a desired amount of time, wherein no current dissipates in said circuit during said standby phase.

* * * * *

UNITED STATES PATENT AND TRADEMARK OFFICE
CERTIFICATE OF CORRECTION

PATENT NO.    : 5,666,078
DATED         : September 9, 1997
INVENTOR(S)   : Steven H. Lamphier, et al.

Page 1 of 3

It is certified that error appears in the above-identified patent and that said Letters Patent is hereby corrected as shown below:

The title page should be deleted and substitute therefor the attached title page.

Delete Drawing Sheet 1 and substitute therefor the Drawing Sheet consisting of FIG.1, as shown on the attached page.

Signed and Sealed this

Seventh Day of April, 1998

Attest:

BRUCE LEHMAN

*Attesting Officer*                   *Commissioner of Patents and Trademarks*

United States Patent [19]
Lamphier et al.

[11] Patent Number: 5,666,078
[45] Date of Patent: Sep. 9, 1997

[54] PROGRAMMABLE IMPEDANCE OUTPUT DRIVER

[75] Inventors: Steven H. Lamphier, St. Albans; Harold Pilo, Underhill, both of Vt.; Michael J. Schneiderwind, Castlerock, Colo.; Fred J. Towler, Essex Junction, Vt.

[73] Assignee: International Business Machines Corporation, Armonk, N.Y.

[21] Appl. No.: 597,655

[22] Filed: Feb. 7, 1996

[51] Int. Cl.[6] ............................ H03K 19/0185
[52] U.S. Cl. ............................ 327/108; 326/30
[58] Field of Search ............ 327/63, 64, 108, 327/109, 111, 112, 210, 211, 212; 326/30, 37, 40, 49, 50, 82, 83, 86

[56] References Cited

PUBLICATIONS

Thaddeus J. Gabara and Scott C. Knauer; Digitally Adjustable Resistors in CMOS for High-Performance Applications; Mar. 12, 1992.

*Primary Examiner*—Timothy P. Callahan
*Assistant Examiner*—My-Trang Nu Ton
*Attorney, Agent, or Firm*—Schmeiser, Olsen & Watts; Howard J. Walter, Jr.

[57] ABSTRACT

An output driver circuit is disclosed that generates an accurate and predictable output impedance driver value corresponding to a programmable external impedance. The output driver circuit includes an external resistance device, voltage comparator device, control logic, an evaluate circuit and off-chip driver (OCD) circuit. Voltage from the external resistance device (VZQ) is compared with voltage created from the evaluate circuit (VEVAL) by the voltage comparator device, which indicates to the control logic whether VEVAL is greater than or less than VZQ. The control logic will adjust the evaluate circuit accordingly with a count until the two voltages are basically equal (i.e., the count is alternating between two adjacent binary count values). At which time the control logic operates the OCD with the lower of the two adjacent count values to produce a proper and predictable driving impedance.

9 Claims, 3 Drawing Sheets

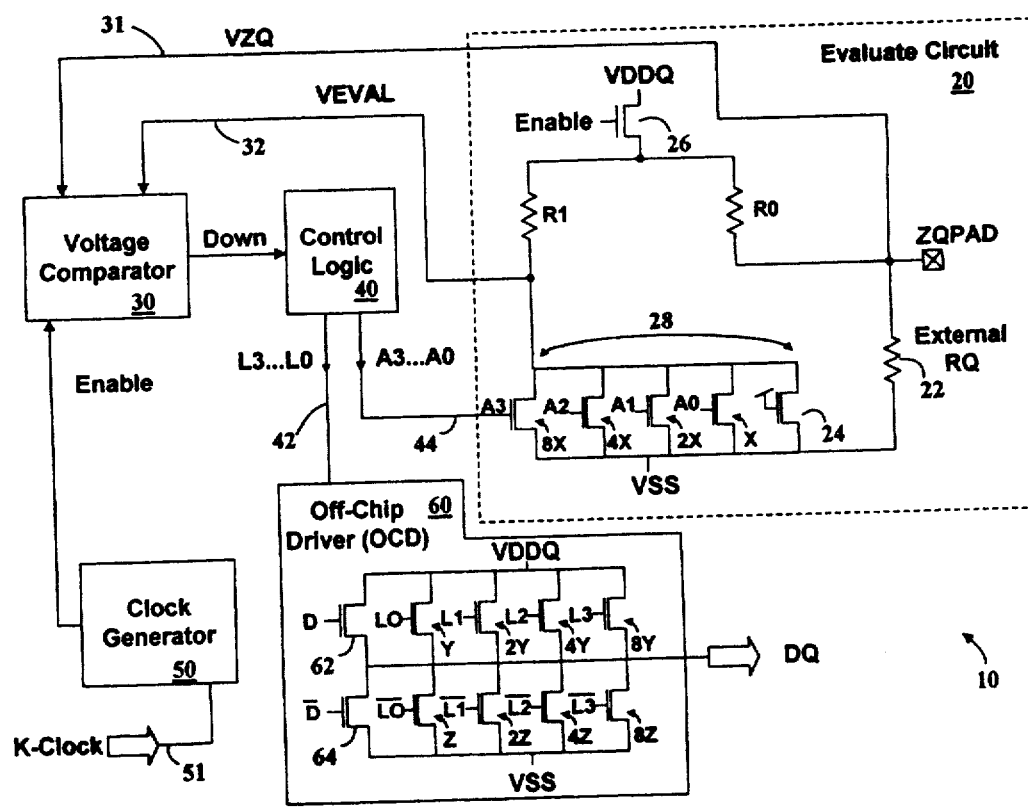

Patent No.: 5,666,078